United States Patent
He et al.

(10) Patent No.: US 11,544,010 B2
(45) Date of Patent: Jan. 3, 2023

(54) APPARATUSES AND METHODS TO MASK WRITE OPERATIONS FOR A MODE OF OPERATION USING ECC CIRCUITRY

(71) Applicant: Micron Technology, Inc., Boise, ID (US)

(72) Inventors: Yuan He, Boise, ID (US); Ming-Bo Liu, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/332,909

(22) Filed: May 27, 2021

(65) Prior Publication Data

US 2021/0294533 A1 Sep. 23, 2021

Related U.S. Application Data

(63) Continuation of application No. 16/559,497, filed on Sep. 3, 2019, now Pat. No. 11,023,173.

(51) Int. Cl.
| | |
|---|---|
| H03M 13/09 | (2006.01) |
| H04L 1/00 | (2006.01) |
| G06T 1/20 | (2006.01) |
| G06F 9/50 | (2006.01) |
| G06F 3/06 | (2006.01) |
| G11C 7/10 | (2006.01) |
| G06F 11/10 | (2006.01) |
| G11C 8/10 | (2006.01) |

(52) U.S. Cl.
CPC .......... *G06F 3/0659* (2013.01); *G06F 3/0625* (2013.01); *G06F 3/0673* (2013.01); *G06F 11/1076* (2013.01); *G11C 7/1069* (2013.01); *G11C 7/1096* (2013.01); *G11C 8/10* (2013.01)

(58) Field of Classification Search
CPC .. G06F 3/0673; G06F 3/0659; G06F 11/1076; G11C 8/10; G11C 7/1096; G11C 7/1069
See application file for complete search history.

(56) References Cited

U.S. PATENT DOCUMENTS

| | | | |
|---|---|---|---|
| 6,418,067 | B1 | 7/2002 | Watanabe et al. |
| 11,023,173 | B2 * | 6/2021 | He .................. G06F 3/0659 |
| 2005/0149678 | A1 | 7/2005 | Stolowitz |
| 2007/0028027 | A1 | 2/2007 | Janzen et al. |
| 2008/0151657 | A1 | 6/2008 | Ha et al. |
| 2008/0168331 | A1 * | 7/2008 | Vogelsang .......... G11C 7/1006 714/770 |
| 2017/0243629 | A1 | 8/2017 | Chen et al. |
| 2017/0278565 | A1 | 9/2017 | Pallerla et al. |
| 2018/0074895 | A1 | 3/2018 | Choi et al. |

(Continued)

*Primary Examiner* — Guy J Lamarre
(74) *Attorney, Agent, or Firm* — Dorsey & Whitney LLP

(57) ABSTRACT

An exemplary semiconductor device includes an input/output (I/O) circuit configured to combine data corresponding to a write command received via data terminals with a first subset of corrected read data retrieved from a memory cell array to provide write data. The exemplary semiconductor device further includes a write driver circuit configured to mask a write operation of a first bit of the write data that corresponds to a bit of the first subset of the read data and to perform a write operation for a second bit of the write data that corresponds to the data received via the data terminals.

20 Claims, 10 Drawing Sheets

(56) References Cited

U.S. PATENT DOCUMENTS

2018/0166129 A1 6/2018 Mehta et al.
2020/0036396 A1 1/2020 Shang et al.
2021/0064282 A1 3/2021 He et al.

* cited by examiner

US 11,544,010 B2

APPARATUSES AND METHODS TO MASK WRITE OPERATIONS FOR A MODE OF OPERATION USING ECC CIRCUITRY

CROSS-REFERENCE TO RELATED APPLICATION

This application is a continuation of U.S. patent application Ser. No. 16/559,497, filed Sep. 3, 2019. This application is incorporated by reference herein in its entirety and for all purposes.

BACKGROUND OF THE INVENTION

High data reliability, high speed of memory access, low power, and reduced chip size are features that are demanded from semiconductor memory. In some applications, semiconductor memory devices may be designed to operate in more than one mode to accommodate different applications, such as different data bus widths. However, introducing configurability may increase complexity in design, power consumption, or latency. For example, execution of a write operation within a semiconductor memory device for a first bus width may be different than execution of a write operation for a second bus width within the semiconductor memory device. It may be preferable to mitigate some of the effects of the increased complexity resulting from implementing configurability options.

DETAILED DESCRIPTION

Figure 1:
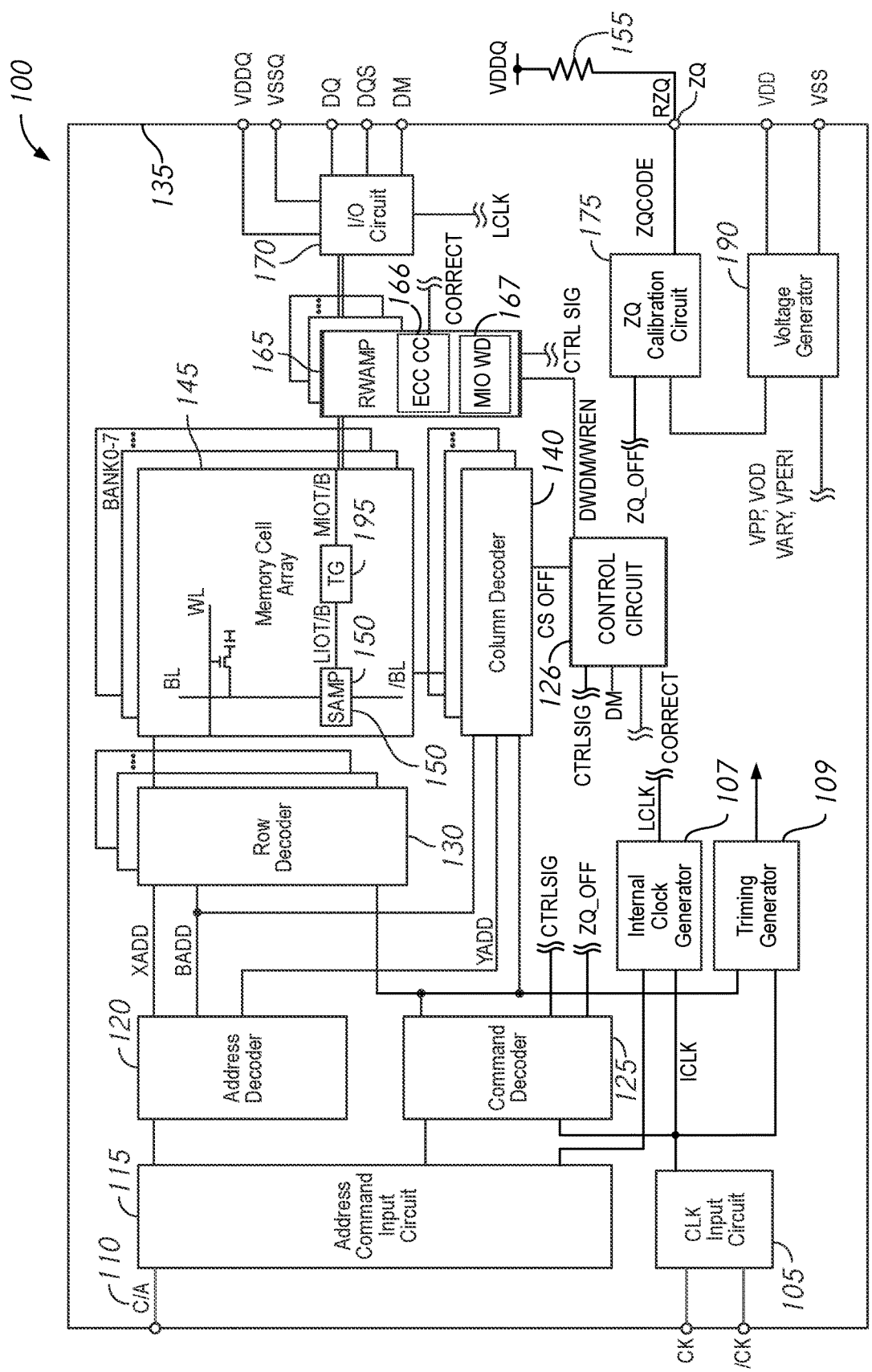
FIG. 1 is a block diagram of a semiconductor device in accordance with an embodiment of the disclosure.

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes circuitry and techniques for reducing current draw during write operations in certain modes of operation by masking some write operations. A semiconductor device may be capable of operating in system implementations with different data bus widths. For example, the semiconductor device may be configured to operate a selected one of multiple input/output (I/O) bus configurations (e.g., data bus width modes), such as an x4 mode (e.g., data bus is 4 bits wide), an x8 mode (e.g., data bus is 8 bits wide), etc. During a read or write operation, data bits may be sent or received over a fixed burst length (e.g., 8, 16, 32, etc. bit burst lengths). Thus, the number of write bits received when in the x4 mode may be different than the number of write bits received when operating in the x8 mode. For example, if the burst length is 16 bits, then 64 bits would be received in the x4 mode and 128 bits would be received in the x8 mode.

To reduce complexity with generation of error detection codes to indicate whether data read from an address of a memory cell array matches data that was previously written to the address of the memory cell array, the internal read/write circuitry may be configured to generate error detection codes based on a fixed number of bits that is independent of the selected I/O bus configuration. Thus, error-correcting code (ECC) circuitry may generate ECCs for a fixed number of data bits to be written to memory that are then stored at in the memory cell array along with the write data. In some examples, when fewer bits of write data are received via the I/O bus for a write operation directed to a particular address than are needed to generate the ECC, the semiconductor device may first perform a read operation to retrieve read data from the particular address, and combine a first subset of read data (e.g., old data) with the write data received via the I/O bus for the write operation (e.g., new data) to form a set of write data bits to be written to the array. For example, bits in bit positions K (e.g., wherein X is equal to 127, 63, etc.) to M+1 (e.g., wherein M is equal to 63, 31, etc.) of the set of write data bits may include the write data received from via the I/O bus and bits in bit positions M to 0 may include the first subset of read data. As another example, bits in bit positions K to M+1 of the set of write data bits may include the first subset of read data and bits in bit positions M to 0 may include the write data received from via the I/O bus. The ECC circuitry may generate an ECC code for the write data bits being written to the array. In this scenario, the subset of read data may be written back to the memory, along with the write data received via the I/O bus and the new ECC code.

During both read and write operations, column select (CS) signal lines are enabled and at least one pair of data lines (e.g., main I/O (MIO) or global I/O (GIO)) are driven to complementary logical voltage polarities. Typically, the CS signal lines remain enabled until a read and/or write operation is completed. In addition, the voltage differential between the pair of data signal lines is smaller for a read operation than a write operation. Thus, charging the pair of data signal lines during the write operation uses more current than charging the signal lines during the read operation. In addition, when a write or read operation is complete, the pair of data signal lines are equalized to prepare for a subsequent read or write operation. Thus, because the voltage differential is higher for a write operation, current consumption to equalize the pair of data signal lines is greater than equalization current consumption for post-read operation equalization.

Thus, to save power in this scenario, control circuitry may disable or turn off selected CS signal lines for a subset of control planes corresponding to the old data that is being written back to the memory cell array in response to an indication that no error is found by the ECC circuits. In addition, write driver circuitry may mask write operations for unchanged old data of the write data to avoid driving the pair of data signal lines to write voltage polarities. Lastly, during a write operation, write operations for individual bits of the new data may be masked that match corresponding bits of a second subset of the read data that is being overwritten with the new data. By turning off CS signal lines when no error is found and masking write operations for at least some of the write data bits, current consumption driving the CS signal lines and driving the pair of data signal lines and during equalization may be reduced.

FIG. 1 is a schematic block diagram of a semiconductor device 100, in accordance with an embodiment of the present disclosure. For example, the semiconductor device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a control circuit 126, a plurality of row decoders 130, a memory cell array 145 including sense amplifiers 150 and transfer gates 195, a plurality of column decoders 140, a plurality of read/write amplifiers 165, an input/output (I/O) circuit 170, a 172, the ZQ resistor (RZQ) 155, a ZQ calibration circuit 175, and a voltage generator 190. The semiconductor device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate 160, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, a mod register setting command MRS that may cause mode register settings to be stored at the control circuit 126, and a ZQ calibration command ZQ_com that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

During both read and write operations, the column decoders 140 may drive column select CS signals and the main IO write driver circuit 167 may each drive a respective pair of the main IO lines to complementary logical voltage polarities based on the row and column addresses. The voltage differential between the respective pair of signal lines driven by the main IO write driver circuit 167 may be smaller for a read operation than a write operation. Thus, during a write operation, current consumption to drive the respective pair of main I/O lines and to equalize the respective pair of main I/O lines to prepare for a subsequent read or write operation may be greater than drive and equalization current consumption for read operations.

In some examples, the semiconductor device 100 may be configured to operate the IO circuit 170 in a selected one of multiple data terminal DQ bus configurations (e.g., data bus width modes), such as an x4 mode (e.g., data bus is 4 bits wide), an x8 mode (e.g., data bus is 8 bits wide), etc. During a read or write operation, data bits are sent or received via the data terminals DQ over a fixed burst length (e.g., 8, 16, 32, etc. bit burst lengths), in some examples. Thus, the number of write bits received when in the x4 mode may be different than the number of write bits received when operating in the x8 mode. For example, if the burst length is 16 bits, then 64 bits would be received in the x4 mode and 128 bits would be received in the x8 mode.

To reduce complexity associated with generating error correction and detection codes generated for data written to the memory cell array 145, the column decoders 140, the row decoders 130, the read/write amplifiers 165, and/or the main IO write driver circuit 167 may be configured to read and write a fixed number of bits from and to the memory cell array 145 independent of the selected data terminal DQ bus configuration. Read and writing a fixed number of bits may simplify operation of ECC control circuit 166 configured to detect and correct errors in data read from the memory cell array 145. For example, the ECC control circuit 166 may generate ECCs for a fixed number of data bits to be written to the memory cell array 145. The ECCs are written to the memory cell array 145 along with the write data bits. In some examples, when fewer bits of write data are received via the data terminals DQ than are needed to write data to the memory cell array 145, then the semiconductor device 100 may first perform a read operation via the read/write amplifiers 165 to retrieve read data from the row and column address associated with the write operation. The ECC control circuit 166 may check the read data for errors to provide corrected read data. The read/write amplifiers 165 or the IO circuit 170 may combine a first subset of the corrected read data (e.g., old data) with the write data received via the data terminals DQ for the write operation (e.g., new data) to form a set of write data to be written to the memory cell array 145. The ECC control circuit 166 may generate an ECC code for the write data bits being written to the memory cell array 145. Thus, in this scenario, the old data may be written back to the memory.

However, to reduce current, some CS signals may be turned off if no error is detected in a part of the read data being written back to the memory and some write operations may be masked, such as for uncorrected old data or new data that matches old data, in some examples. The control circuit 126 may provide CS off signals CSOFF to cause the column decoders 140 to turn off corresponding CS signals and to provide data write data mask and write enable signals DWDM/WREN to the read/write amplifiers 165 based on control signals CTRL (e.g., an X4 signal, a column address signal CA<10>, timing signals, etc.) received from the command decoder 125, correct signals CORRECT received from the ECC CC 166, and DM signal from the IO circuit 170. When in the x4 mode, the control circuit 126 may be configured to set the DWDM signals based on the CTRL signals (e.g., a value of a column address bit, such as CA<10>). Otherwise, the DWDM signal may be set based on the DM signal. The control circuit 126 may be configured to enable the CSOFF signal in response the CORRECT signals indicating no error in control planes where data from the previous read operation is being written back (e.g., control planes determined based on the DWDM signal). Timing for enabling the CSOFF signal may be determined based on timing signals from the CTRL signals. By setting the CSOFF signal to cause the column decoders 140 to turn off corresponding CS signal lines, current consumption may be reduced. The control circuit 126 may be further configured to enable the WREN signal according to timing signals from the CTRL signals.

In response to the WREN signal and based on the DWDM signals, the main IO write driver circuit 167 may mask write operations for the old data that were not corrected to avoid driving the pair of main I/O signal lines to write voltage polarities. In addition, the main IO write driver circuit 167 may compare individual bits of the new data with corresponding bits of a second subset of the read data, and mask write operations for the bits of the new data bits that match the corresponding bits of the second subset of the read data to avoid driving the pair of main IO signal lines to write voltage polarities. By masking write operations for at least some of the write data bits, current consumption driving the pair of main IO signal lines and during equalization may be reduced.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS.

These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may be mounted on a substrate that is coupled to the calibration terminal ZQ. For example, the ZQ resistor (RZQ) 155 may be coupled to a power supply voltage (VDDQ). An impedance code ZQCODE obtained by the calibration operation may be provided to the IO circuit 170, and thus an impedance of an output buffer (not shown) included in the IO circuit 170 is specified.

Figure 2:
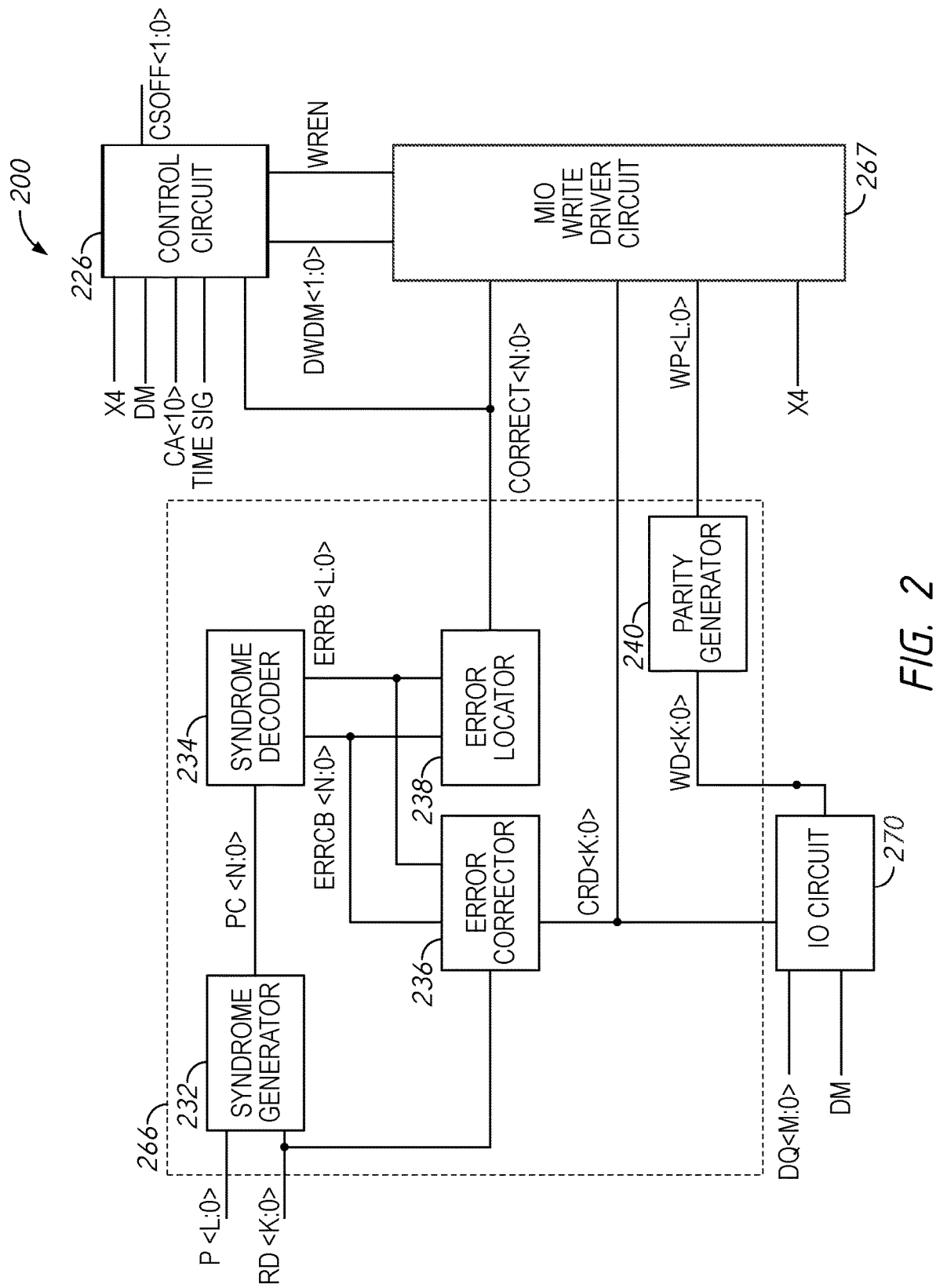
FIG. 2 is a schematic block diagram of a portion of a semiconductor device, in accordance with an embodiment of the present disclosure.

FIG. 2 is a schematic block diagram of a portion of a semiconductor device 200, in accordance with an embodiment of the present disclosure. For example, the semiconductor device 200 may include a control circuit 226, ECC control circuit 266, and main IO write driver circuit 267. The semiconductor device 100 of FIG. 1 may implement the portion of the semiconductor device 200.

The ECC control circuit 266 may include a syndrome generator 232, a syndrome decoder 234, an error corrector 236, an error locator 238, a parity generator 240, and an IO circuit 270. The syndrome generator 232 may receive parity data P<L:0> and read data RD<K:0> from a memory cell array (e.g., the memory cell array 145 of FIG. 1), and may generate syndrome code data PC<N:0> based on the P<L:0> data and the RD<K:0> data. The P<L:0> data may be generated based on the RD<K:0> data when the RD<K:0> data was stored to the memory cell array 145.

Figure 7A:
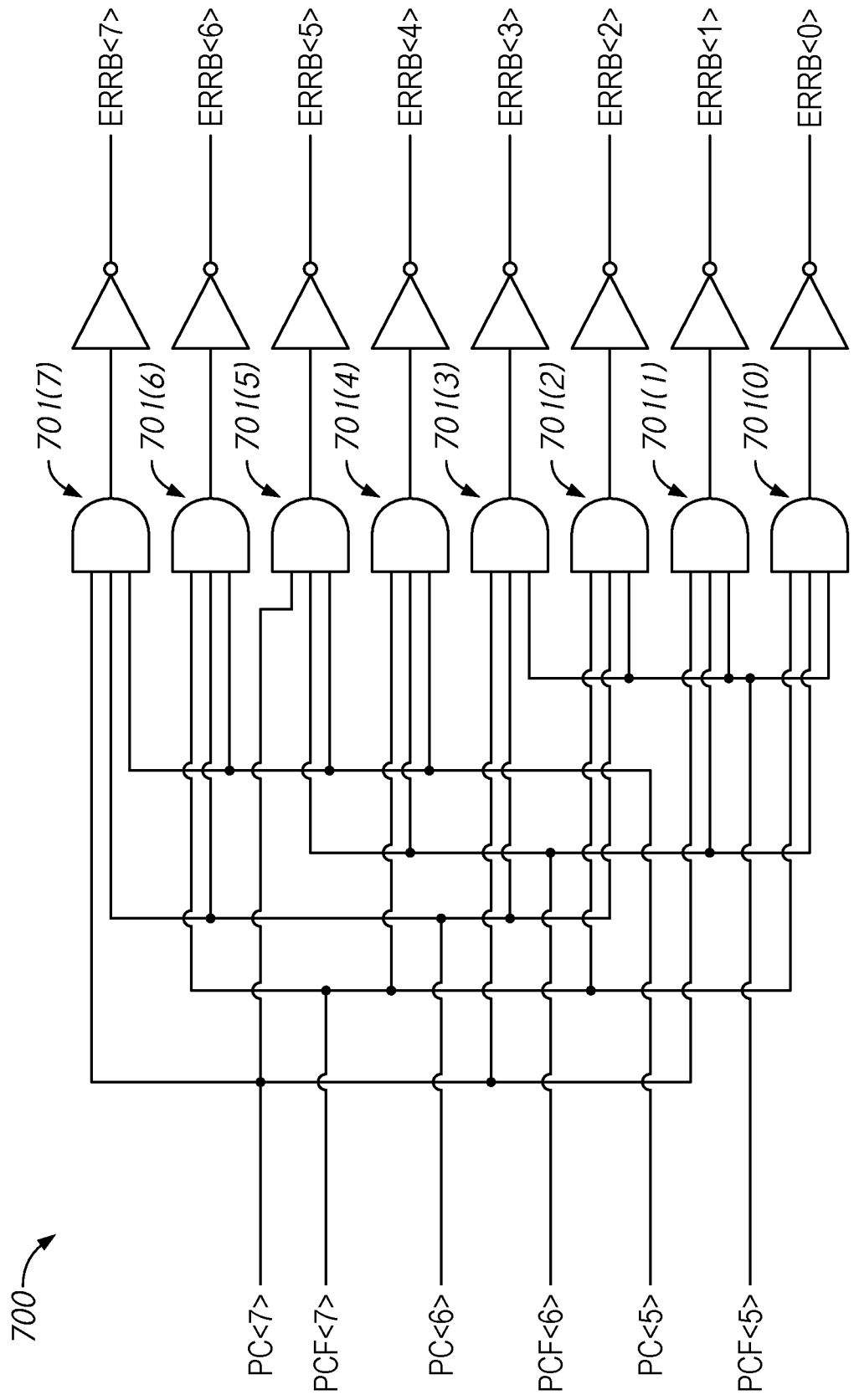
FIG. 7A provides exemplary ECC bit data circuitry, in accordance with embodiments of the present disclosure.
Figure 7B:
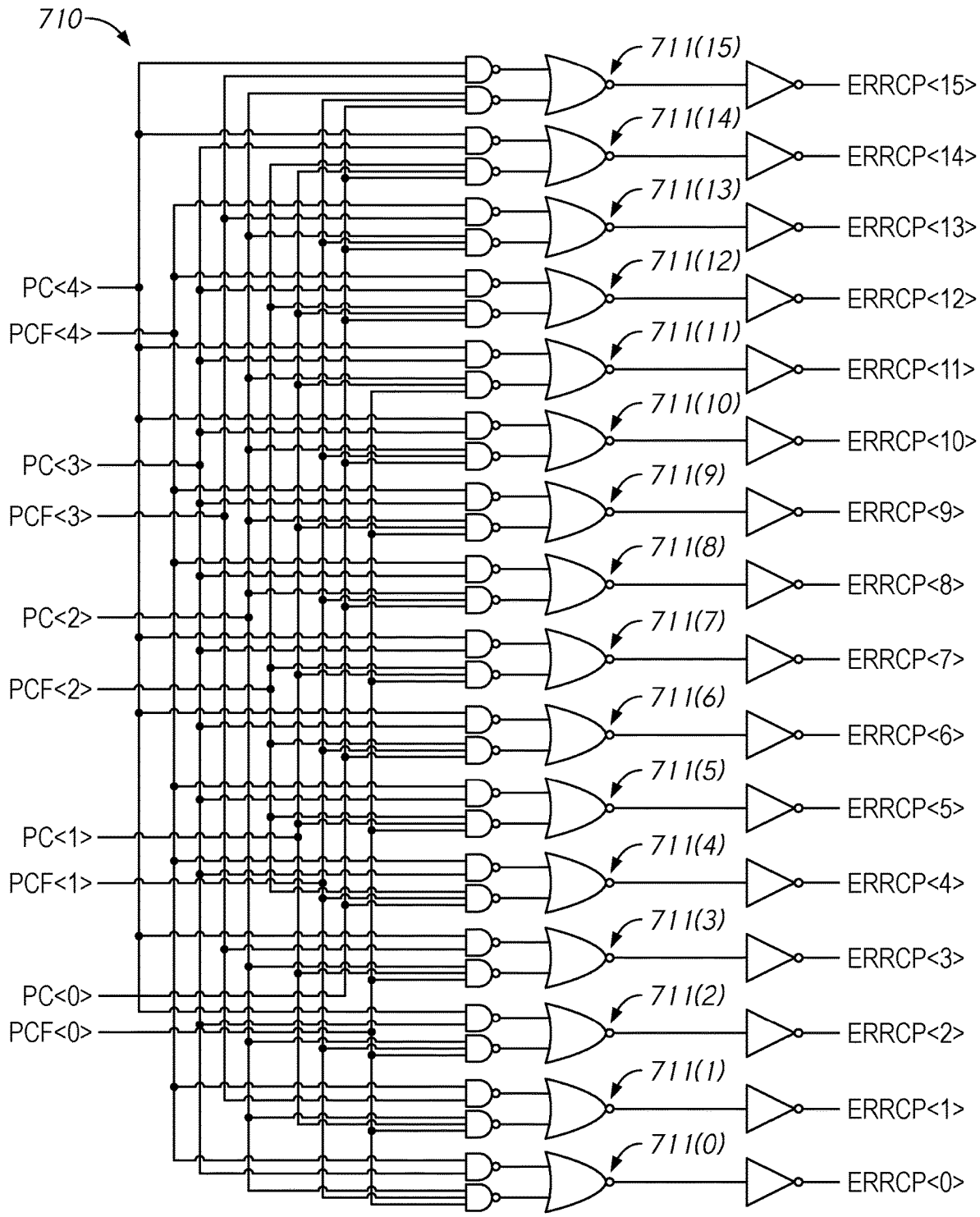
FIG. 7B provides exemplary ECC control plane data circuitry, in accordance with embodiments of the present disclosure.

The syndrome decoder 234 may receive the PC<N:0> data and may generate ECC bit data ERRB<L:0> and ECC control plane data ERRCP<N:0> based on the PC<N:0> data. In some examples, a first logical value (e.g., a low logical value) of a respective bit of the ERRB<L:0> data indicates a respective error and a second logical value (e.g., a high logical value) of the respective bit of the ERRB<L:0> data indicates no respective error. In some examples, a first logical value (e.g., a low logical value) of a respective bit of the ERRCP<N:0> data indicates a respective control plane error and a second logical value (e.g., a high logical value) of the respective bit of the ERRCP<N:0> data indicates no respective control plane respective error. FIGS. 7A and 7B provide exemplary ECC bit data circuitry 700 and ECC control plane data circuitry 710, respectively, with 8 ERRB bits (e.g., N+1 is equal to 8) and 16 control planes (e.g., L+1 is equal to 16), in accordance with embodiments of the present disclosure. In FIG. 7A, the ECC bit data circuitry 700 includes logic circuits 701(7)-(0) each configured to receive a combination of data from the PC<7:5> data (e.g., and/or a complement of PC<7:5> data PCF<7:5>) to provide the respective ERRB<7:0> data. Each of the logic circuits 701(7)-(0) may include a respective AND gate coupled in series with a respective inverter.

In FIG. 7B, the ECC control plane data circuitry 710 includes logic circuits 711(15)-(0) each configured to receive a combination of data from the PC<4:0> data (e.g., and/or a complement of PC<4:0> data PCF<4:0>) to provide the respective ERRCP<15:0> data. Each of the logic circuits 711(15)-(0) may include a respective pair of NAND gates without outputs coupled to a respective OR gate, and an output of the respective OR gate coupled to a respective inverter.

Figure 7C:
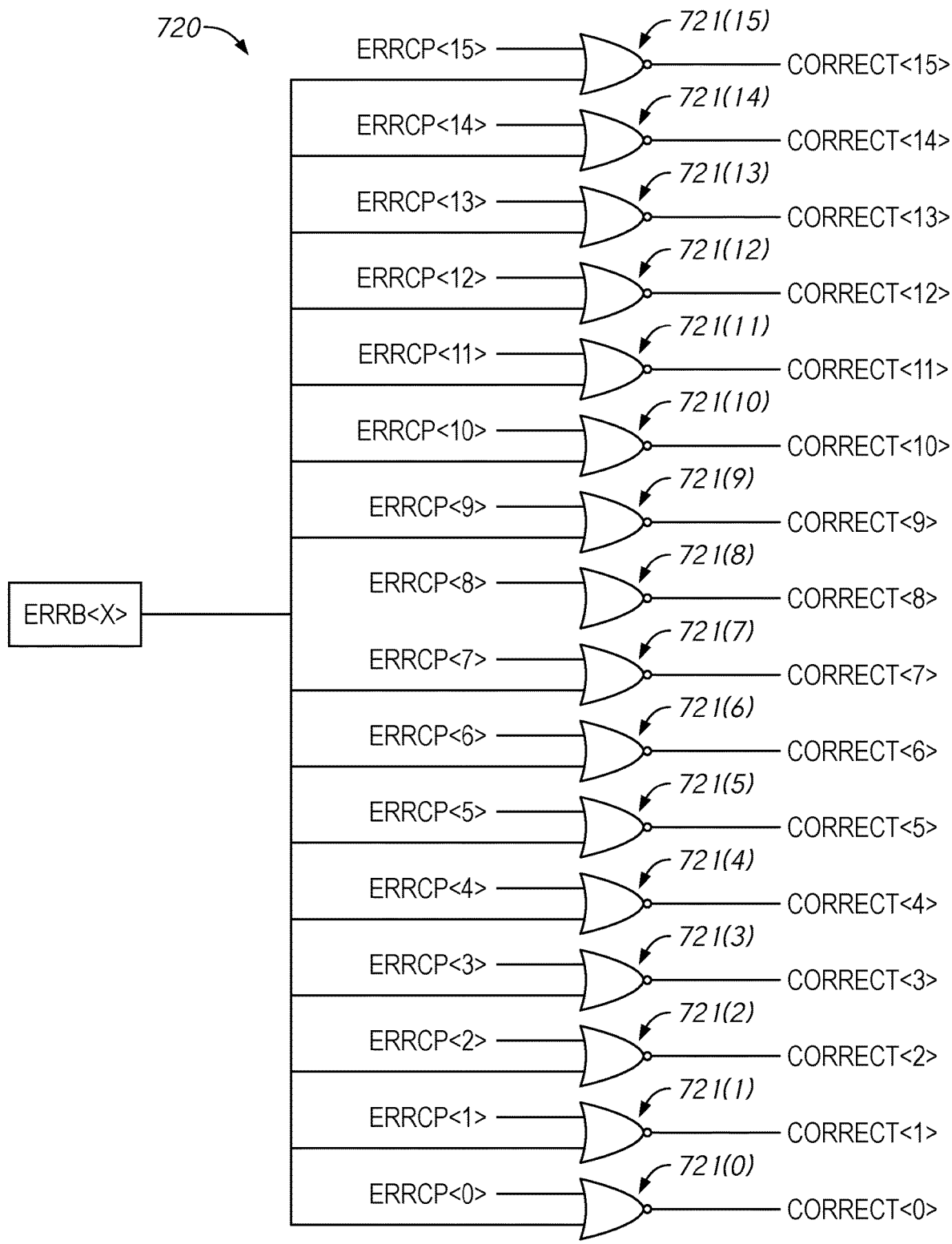
FIG. 7C provides exemplary error location circuitry to compare one ERRB bit with ERRCP bits, in accordance with embodiments of the present disclosure.

Turning back to FIG. 2, the error corrector 236 may receive the RD<K:0>, the ERRB<L:0> data, and the ERRCP<N:0> data, and may provide corrected read data CRD<K:0> based on the ERRB<L:0> and ERRCP<N:0> data. The error locator 238 may receive the ERRB<L:0> and ERRCP<N:0> data and may determine a location of any errors in the RD<K:0> data based on the ERRB<L:0> and ERRCP<N:0> data and may provide correction location data CORRECT<N:0> at an output. The error corrector 236 and/or the error locator 238 may use logic to decode the ERRB<L:0> and ERRCP<N:0> data to locate an error within the RD<K:0> data. FIG. 7C provides exemplary error location circuitry 720 to compare one ERRB<X> bit with 16 ERRCP<15:0> bits (e.g., L+1 is equal to 16), in accordance with embodiments of the present disclosure. In FIG. 7C, the error location circuitry 720 includes logic circuits 721(15)-(0) each configured to receive a combination of data from the ERRB<X> bit (e.g., where X is any integer from 0 to 7) and the ERRCP<15:0> to provide the respective CORRECT<15:0> data. Each of the logic circuits 721(15)-(0) may include a respective NOR gate. Thus, a respective CORRECT<15:0> data bit is set to a high logical value when both of the ERRB<X> bit and the corresponding ERRCP<15:0> data bit are set to a first logical value (e.g., a low logical value). Otherwise, the respective CORRECT<15:0> data bit is set to a second logical value (e.g., a low logical value).

Turning back to FIG. 2, the parity generator 240 may receive write data WD<K:0> from the IO circuit 270 (e.g., the IO circuitry 170 of FIG. 1) and provide write parity data WP<L:0> at an output. The IO circuit 270 may receive data DQ<M:0> via data terminals, CRD<K:0> data, and a data terminal mode signal X4. During a write operation when the X4 signal has a first value (e.g., logical low value), the IO circuit 270 may provide the DQ<M:0> data as the WD<K:0> (e.g., K is equal to M). During a write operation when the X4 signal has a second value (e.g., logical high value), the IO circuit 270 may provide a combination of the DQ<M:0> data and the CRD<M:0> data as the WD<K:0> data (e.g., M+1 is equal to half of K+1). During a read operation, the IO circuit 270 may provide some or all of the CRD<K:0> data selected based on a value of the X4 signal to the DQ<M:0> data.

The control circuit 226 may generate data mask signals DWDM<1:0>, a write enable signal WREN, and CS off signals CSOFF<1:0> based on the X4 signal, an address bit CA<10>, a data mask signal DM (e.g., received via the DM terminal of FIG. 1), and/or timing signals TIME. The X4 signal, the CA<10> address bit, and the TIME signals may correspond to CTRL signals of FIG. 1. Each of the DWDM<1:0> signals correspond to different respective half of the control planes of a memory cell array. The control circuit 226 may set the DWDM<1:0> signals to a common logical value determined based on the DM signal in response to the X4 signal indicating a first mode (e.g., when the X4 signal has a value indicating a x8 mode). The control circuit 226 may set the DWDM<1:0> signals to complementary logical values determined based on the CA<10> address bit signal in response to the X4 signal indicating a second mode (e.g., when the X4 signal has a value indicating a x4 mode). Thus, in the second mode, the control circuit 226 may set one of the DWDM<1:0> may to a high logical value to enable masking of data write operations for half of the control planes that correspond to the old data, while the control circuit 226 may set the other to a low logical value to disable masking of write operations for the other half of the control planes that correspond to the new data.

The control circuit 226 may provide the CSOFF<1:0> signals to cause column decoders (e.g., the column decoders 140 of FIG. 1) to turn off corresponding CS signals at times determined according to the TIME signals. Similar to the DWDM<1:0> signals, each of the CSOFF<1:0> signals correspond to different respective half of the control planes of the memory cell array. When in a x8 mode (e.g., determined based on the X4 signal), the control circuit 226 is configured to set the CSOFF<1:0> signals to common logical values. When in the x4 mode (e.g., determined based on the X4 signal), the control circuit 226 is configured to enable the CSOFF<1:0> signals based on the CORRECT<N:0> signals and the DWDM<1:0> signals. Each of the CORRECT<N:0> corresponds to a particular control plane of a memory cell array. Thus, when the DWDM<1> signal is enabled and according to timing of the TIME signals, the control circuit 226 may be configured to enable the CSOFF<1> signal in response to a first subset of CORRECT<N:0> signals corresponding to control planes associated with the DWDM<1> signal indicate no error. Otherwise, the CSOFF<1> signal may be disabled. Similarly, when the DWDM<0> signal is enabled and according to timing of the TIME signals, the control circuit 226 may be configured to enable the CSOFF<0> signal in response to a second subset of CORRECT<N:0> signals corresponding to control planes associated with the DWDM<0> signal indicate no error. Otherwise, the CSOFF<0> signal may be disabled. By setting one of the CSOFF<1:> signals during a write operation to cause the column decoders to turn off corresponding CS signal lines, current consumption may be reduced. The control circuit 226 may be further configured to enable the WREN signal according to timing of the TIME signals.

Figure 8:
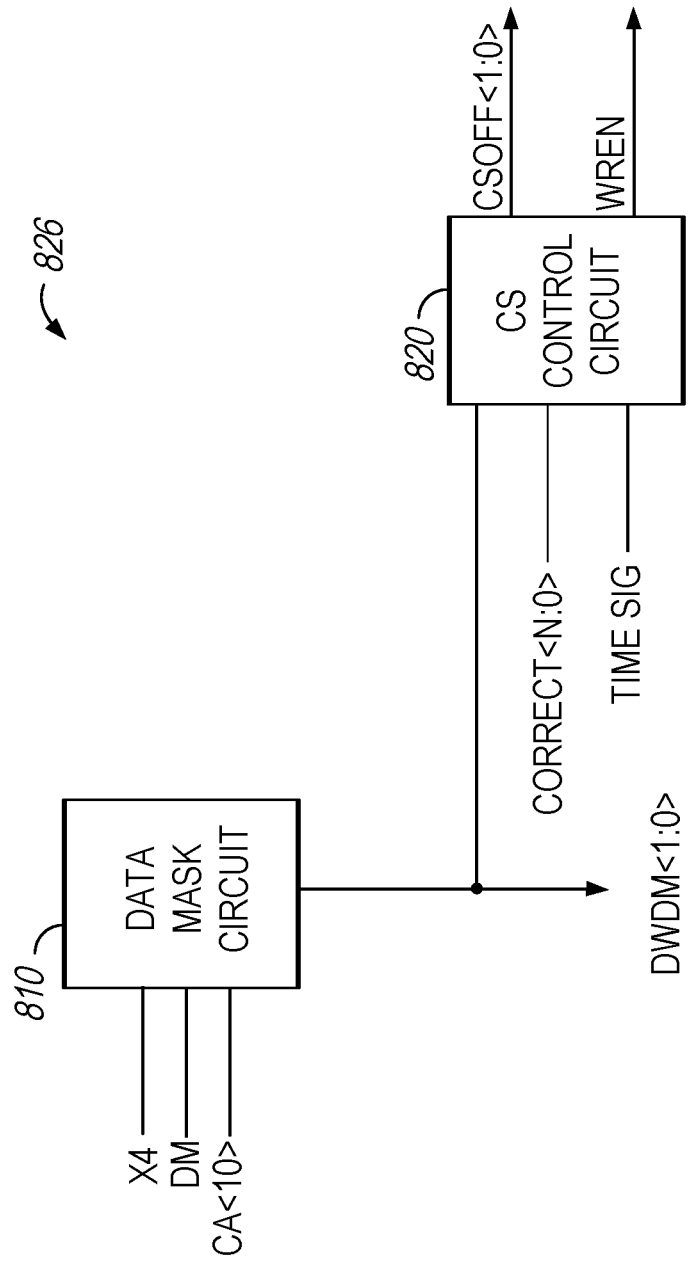
FIG. 8 provides an exemplary control circuit in accordance with embodiments of the present disclosure.

FIG. 8 provides an exemplary control circuit 826 in accordance with embodiments of the present disclosure. The control circuit 826 includes a data mask circuit 810 and a CS control circuit 820. The data mask circuit 810 may generate the DWDM<1:0> signals based on the X4 signal, the CA<10> address bit, and the DM signal. The data mask circuit 810 may set the DWDM<1:0> signals to a common logical value determined based on the DM signal in response to the X4 signal indicating a first mode (e.g., when the X4 signal has a value indicating a x8 mode). The data mask circuit 810 may set the DWDM<1:0> signals to complementary logical values determined based on the CA<10> address bit signal in response to the X4 signal indicating a second mode (e.g., when the X4 signal has a value indicating a x4 mode). Thus, in the second mode, the data mask circuit 810 may set one of the DWDM<1:0> to a high logical value to enable masking of data write operations for half of the control planes that correspond to the old data, while the data mask circuit 810 may set the other to a low logical value to disable masking of write operations for the other half of the control planes that correspond to the new data.

At times determined according to the TIME signals, the CS control circuit 820 may provide the CSOFF<1:0> signals to cause column decoders (e.g., the column decoders 140 of FIG. 1) to turn off corresponding CS signals and the WREN signal to enable write operations. In some examples, the CS control circuit 820 may include a state machine to determine when and how to set the CSOFF<1:0> signals and the WREN signal. When in a x8 mode (e.g., determined based on the X4 signal), the CS control circuit 820 is configured to set the CSOFF<1:0> signals to common logical values. When in the x4 mode (e.g., determined based on the X4 signal), the CS control circuit 820 is configured to enable the CSOFF<1:0> signals based on the CORRECT<N:0> signals and the DWDM<1:0> signals from the data mask circuit 810. Thus, when the DWDM<1> signal is enabled and according to timing of the TIME signals, the CS control circuit 820 may be configured to enable the CSOFF<1> signal in response to a first subset of CORRECT<N:0> signals corresponding to control planes associated with the DWDM<1> signal indicate no error. Otherwise, the CSOFF<1> signal may be disabled. Similarly, when the DWDM<0> signal is enabled and according to timing of the TIME signals, the CS control circuit 820 may be configured to enable the CSOFF<0> signal in response to a second subset of CORRECT<N:0> signals corresponding to control planes associated with the DWDM<0> signal indicate no error. Otherwise, the CSOFF<0> signal may be disabled. The control circuit 226 may be further configured to enable the WREN signal according to timing of the TIME signals.

Turning back to FIG. 2, the main IO write driver circuit 267 may receive the CORRECT<N:0> data, the CRD<K:0> data, the WP<L:0> data, the WD<K:0> data, the DWDM<1:0> signals, the X4 signal, a write enable signal WREN (e.g., via control signals from a command decoder, such as the CTRL signals from the command decoder 125 of FIG. 1). During a write operation, the main IO write driver circuit 267 may be configured to drive main IO lines for various control planes of a memory cell array based on values of the CORRECT<N:0> data, the CRD<K:0> data, the WP<L:0> data, the WD<K:0> data, the DWDM<1:0> signals, the X4 signal, the WREN signal, or combinations thereof.

In operation, the ECC control circuit 266 and the IO circuit 270 may support a read operation from a memory cell array and the ECC control circuit 266, the IO circuit 270, the control circuit 226, and the main IO write driver circuit 267 may support a write operation to the memory cell array. In some examples, the semiconductor device 200 may be configured to operate the IO circuit IO circuit 270 in a selected one of multiple data terminal DQ bus configurations (e.g., data bus width modes), such as a x4 mode (e.g., data bus is 4 bits wide), a x8 mode (e.g., data bus is 8 bits wide), etc. The X4 signal be determine the selected DQ bus configuration, in some examples. For example, when the X4 signal is set to a low logical value, the semiconductor device 200 may operate in a first mode (e.g., a x8 data mode). When the X4 signal is set to a high logical value, the semiconductor device 200 may operate in a second mode (e.g., a x4 data mode). During a read or write operation, data bits are sent or received via the data terminals DQ over a fixed burst length (e.g., 8, 16, 32, etc. bit burst lengths), in some examples. Thus, the number of write bits received when in the x4 mode may be different than the number of write bits received when operating in the x8 mode. For example, if the burst length is 16 bits, then 64 bits would be received in the x4 mode and 128 bits would be received in the x8 mode.

Thus, when a read command and a row address and a column address are received at the semiconductor device 200, the RD<K:0> data and the P<L:0> data may be read from the memory cell array designated by the row address and the column address. The syndrome generator 232 may be configured to generate the PC<N:0> data based on the P<L:0> data and the RD<K:0> data. The syndrome decoder 234 may decode the PC<N:0> data to provide both the ERRB<L:0> data and ERRCP<N:0> data. The error corrector 236 may decode the ERRB<L:0> data and ERRCP<N:0> data to correct errors within the RD<K:0> to provide the CRD<K:0> data. Based on the mode of operation determined by the X4 signal, the IO circuit 270 may provide some or all of the CRD<K:0> data as the DQ<M:0> data. For example, when in the first mode (e.g., the x8 mode), the IO circuit 270 may provide all of the CRD<K:0> bits as the DQ<M:0> data (e.g., M is equal to K). When in the second mode (e.g., the x4 mode), the IO circuit 270 may provide a selected M+1 bits of the CRD<K:0> data (e.g., CRD<K:M+1> data, CRD<M:0> data, or some other combination of M+1 bits of the CRD<K:0> data) as the DQ<M:0> data. The selected subset of the M+1 bits of the CRD<K:0> data may be based on the received column and row address.

When a write command and a row address and a column address are received at the semiconductor device 200, write data may be received at the IO circuit 270 via the DQ<M:0> data. When in the first mode (e.g., the x8 mode), the IO circuit 270 may provide all of the DQ<M:0> data as the WD<K:0> data (e.g., M is equal to K) to the parity generator 240. The parity generator 240 may encode the WP<L:0> data based on the WD<K:0> data. The control circuit 226 may drive the DWDM<1:0> signals based on the DM signal when in the first mode. In addition the control circuit 226 may enable the WREN signal according to timing of the TIME signals during the write operation to enable writing to the memory cell array. The main IO write driver circuit 267 may drive main IO lines to write the WD<K:0> and the WP<L:0> data to the memory cell array in response to the WREN signal, with some write operations masked by the DWDM<1:0> signals.

When operating in the second mode (e.g., x4 mode), a count of the M+1 bits received in the DQ<M:0> data may be less than a count of K+1 bits of the WD<K:0> data used by the parity generator 240 to generate the WP<L:0> bits. In an example, M+1 may be half of K+1. In a specific example, M may be equal to 64 and K may be equal to 128. Thus, the semiconductor device 200 may first perform a read operation to retrieve additional data to combine with the DQ<M:0> data to provide the WD<K:0> data. The read operation may include retrieving the RD<K:0> data and the P<L:0> data from the memory cell array at a location determined by the row and column addresses of received with the write command. The read operation may include the syndrome generator 232, the syndrome decoder 234, and the error corrector 236 processing the RD<K:0> data and the P<L:0> data to provide the ERRB<L:0> data, the ERRCP<N:0> data, and the CRD<K:0> data. In addition, the error locator 238 may provide the CORRECT<N:0> data.

Figure 5:
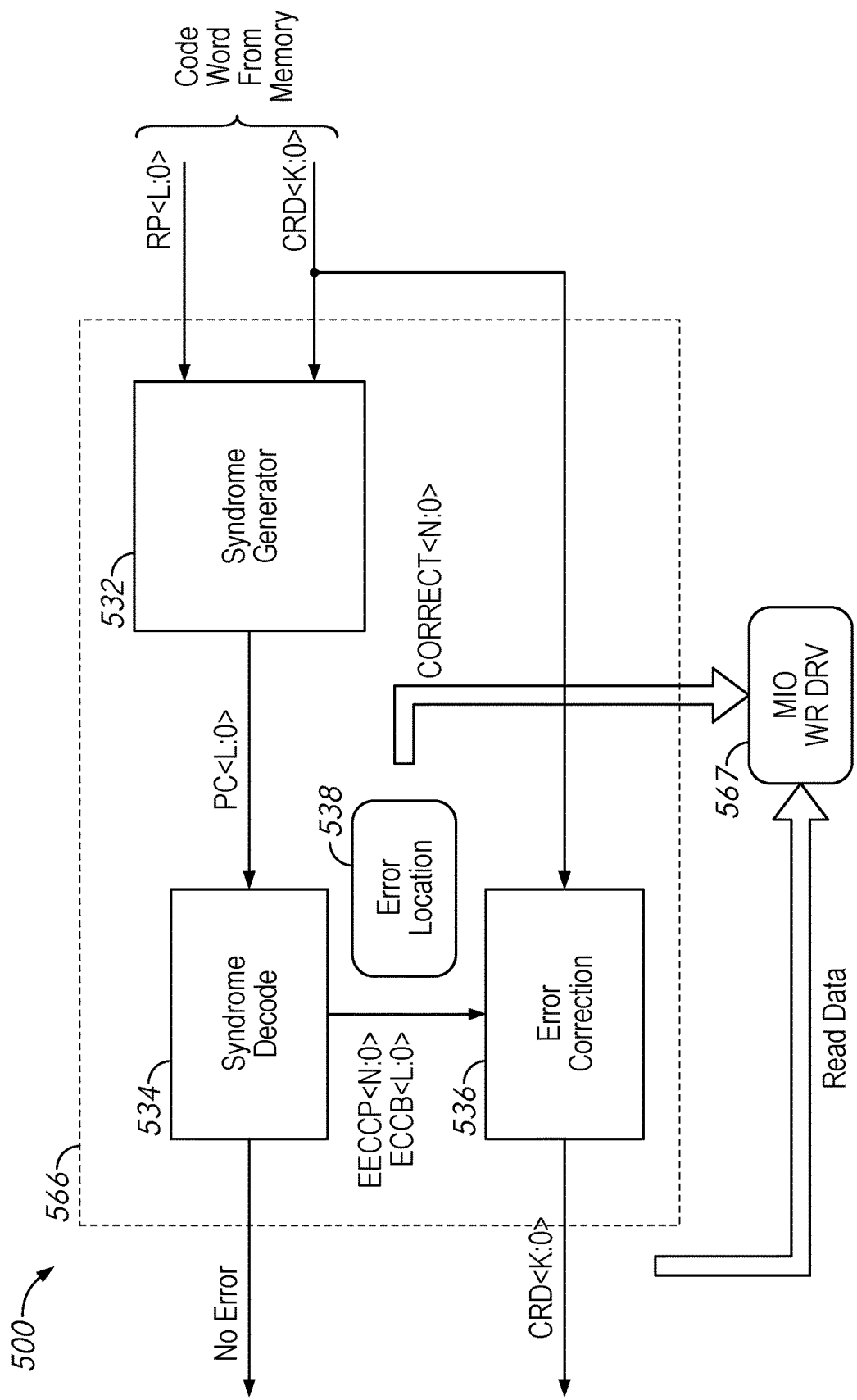
FIG. 5 provides an exemplary flow diagram of a second mode initial read operation, in accordance with embodiments of the present disclosure.

For example, FIG. 5 provides an exemplary flow diagram of the second mode initial read operation, in accordance with embodiments of the present disclosure. As shown in FIG. 5, the syndrome generator 532 may receive the RP<L:0> data and the RD<K:0> data from the memory cell array, and may generate the PC<L:0> data in response. The syndrome decoder 534 may generate the ERRB<L:0> data and the ERRCP<N:0> data based on the PC<L:0> data. The error locator 538 may determine locations of errors and provide the CORRECT<N:0> data to the main IO driver circuit 567 by decoding the ERRB<L:0> data and the ERRCP<N:0> data. The error correction 536 may correct the RD<K:0> data based on the ERRB<L:0> data and the ERRCP<N:0> data.

Turning back to FIG. 2, the IO circuit 270 may combine the CRD<M:0> data subset (e.g., old data) with the DQ<M:0> data (e.g., new data) to provide the WD<K:0> data. The parity generator 240 may encode the WP<L:0> data based on the WD<K:0> data. The control circuit 226 may provide complementary values on the DWDM<1:0> signals based on a value of the CA<10> bit while in the second mode. For example, when the CA<10> bit has a first logical value, the control circuit 226 may provide the DWDM<1> signal with a first logical value and the DWDM<0> with a second logical value. When the CA<10> bit has a second logical value, the control circuit 226 may provide the DWDM<1> signal with the second logical value and the DWDM<0> with the first logical value. In addition, according to timing of the TIME signals, the control circuit 226 may be configured to enable one of the CSOFF<1:0> signals when no error is detected according to a respective subset of the CORRECT<N:0> signals that corresponding to control planes associated with an enabled one of the DWDM<1:0> signals (e.g., corresponding to old data being written back to the memory cell array). Thus, when the DWDM<1> signal is enabled and according to timing of the TIME signals, the control circuit 226 may be configured to enable the CSOFF<1> signal in response to a first subset of CORRECT<N:0> signals corresponding to control planes associated with the DWDM<1> signal indicate no error. Otherwise, the CSOFF<1> signal may be disabled. Similarly, when the DWDM<0> signal is enabled and according to timing of the TIME signals, the control circuit 226 may be configured to enable the CSOFF<0> signal in response to a second subset of CORRECT<N:0> signals corresponding to control planes associated with the DWDM<0> signal indicate no error. Otherwise, the CSOFF<0> signal may be disabled. The control circuit 226 may be further configured to enable the WREN signal according to timing of the TIME signals. Timing of the WREN signal being enabled and one of the CSOFF<1:0> signals being enabled may be coincident or contemporaneous. By enabling one of the CSOFF<1:0> signals prior to initiating the write operation (e.g., enabling the WREN signal), current consumption may be reduced.

Figure 6:
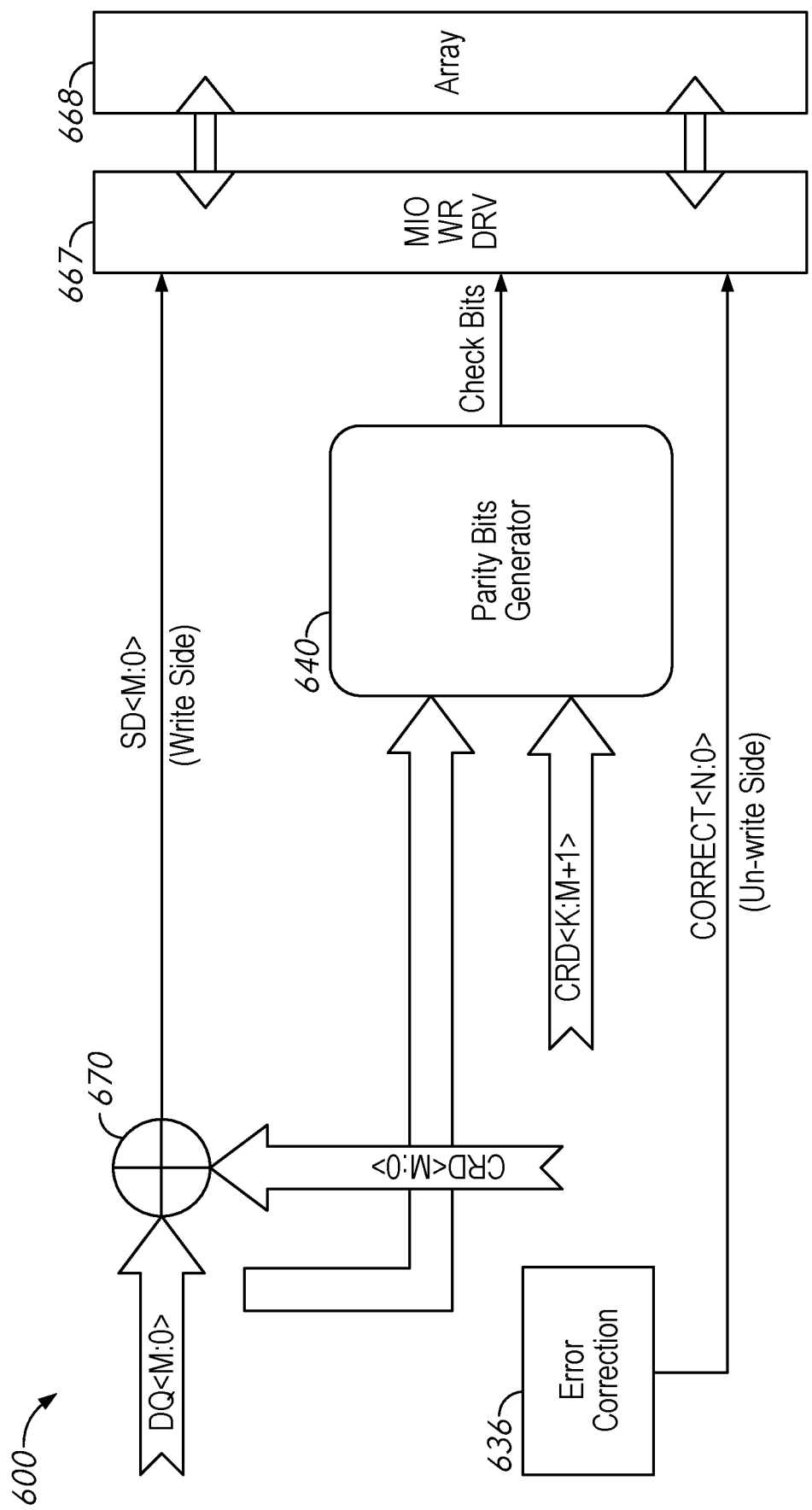
FIG. 6 is an exemplary flow diagram of the second mode write operation for driving signals to a main input/output write driver circuit, in accordance with embodiments of the present disclosure.

The main IO write driver circuit 267 may receive the CORRECT<N:0> data, the CRD<K:0> data, the WD<K:0> data, the WP<L:0> data, the DWDM<1:0> signals, the WREN signal, and the X4 signal. The main IO write driver circuit 267 may drive main IO lines to write the WD<K:0> to the memory cell array based on the received signals/data. FIG. 6 is an exemplary flow diagram of the second mode write operation for driving signals to the main IO write driver circuit 267, in accordance with embodiments of the present disclosure. As shown in FIG. 6, the error corrector 636 may provide the CORRECT<L:0> data (e.g., to indicate which bits have changed in the data being rewritten to the memory cell array 668) and the CRD<K:0> data to the main IO write driver circuit 667, a first subset of the CRD<K:0> data to the comparator 670, and a remaining subset of the CRD<K:0> data to the parity generator 640. The comparator 670 may bitwise compare the remaining subset of the CRD<K:0> data with the DQ<M:0> data to provide a same data signals SD<M:0> that indicate which bits are different to the main IO write driver circuit 667. The parity generator 640 may encode the WP<L:0> data based on a combination of the DQ<M:0> data and the first subset of the CRD<K:0> data (e.g., the WD<K:0> data). The main IO write driver circuit 667 may drive main IO lines to write the WD<K:0> and the WP<L:0> to the memory cell array 668. The main IO write driver circuit 667 may use the SD<M:0> signals to only perform write operations to the memory cell array 668 for bits that are different between the DQ<M:0> data and the first subset of the CRD<K:0> data and may use the CORRECT<L:0> data to only perform write operations to the memory cell array 668 for bits that are corrected within the CRD<K:0>.

Turning back to FIG. 2, based on the DWDM<1:0> signals, the CORRECT<L:0> data, and bitwise differences between overlapping bits of the CRD<K:0> data and the DQ<M:0> data within the WD<K:0> data, the main IO write driver circuit 267 may mask write operations for certain bits of the WD<K:0> data that match previously-stored data. The previously-stored data may be available because of the read operation performed before the write operation while in the second mode. Thus, write operations for the subset of bits of the WD<K:0> that include a direct copy of a subset of the CRD<K:0> data (e.g., old data) that were not corrected (e.g., based on the CORRECT<N:0> data) may be masked to avoid driving the pair of main I/O signal lines to write voltage polarities. In addition, data write operations for the subset of bits of the WD<K:0> that include the DQ<M:0> data (e.g., new data) may be masked for the bits of the new data that match corresponding bits of the CRD<K:0> data (e.g., old data) to avoid driving the pair of main I/O signal lines to write voltage polarities. By masking write operations for at least some of the write data bits, current consumption driving the pair of main IO signal lines and during equalization may be reduced.

Figure 3:
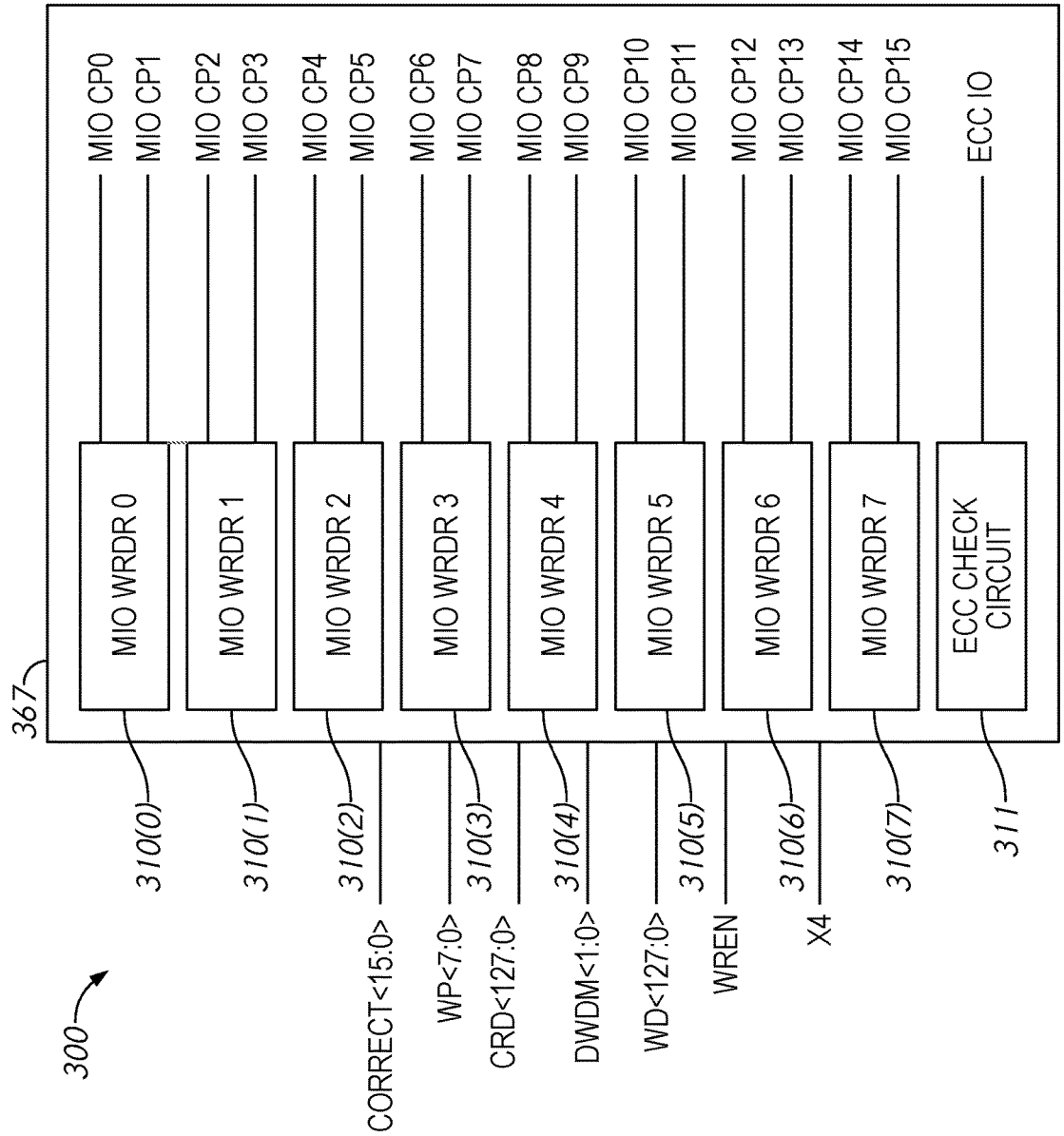
FIG. 3 is a schematic block diagram of a main input/output write driver circuit, in accordance with an embodiment of the present disclosure.

FIG. 3 is a schematic block diagram of a main IO write driver circuit 367, in accordance with an embodiment of the present disclosure. The main IO write driver circuit 167 of FIG. 1 and/or the main IO write driver circuit 267 of FIG. 2 may implement the portion of the main IO write driver circuit 367. The main IO write driver circuit 367 may include individual write drivers 310(0)-(7) each configured to drive respective pairs of control plane main IO lines MIO CP0-15, and a 311 configured to drive a pair of ECC IO signal lines.

The main IO write driver circuit 367 may receive the CORRECT<15:0> data, the CRD<127:0> data, the WP<7:0> data, the WD<127:0> data, the DWDM<1:0> signals (e.g., from the control circuit 126 of FIG. 1 and/or the control circuit 226 of FIG. 2), a write enable signal WREN (e.g., from the control circuit 126 of FIG. 1 and/or the control circuit 226 of FIG. 2), and an X4 signal (e.g., from the CTRL signals of FIG. 1). During a write operation, each of the write drivers 310(0)-(7) may be configured to drive the respective pairs of the MIO CP0-15 signal lines to write data to control planes of a memory cell array based on values of the CORRECT<15:0> data, the CRD<127:0> data, the WP<7:0> data, the WD<127:0> data, the DWDM<1:0> signals, the WREN signal, or combinations thereof. The 311 may be configured to drive the ECC IO signal lines to write the WP<L:0> data to the memory cell array.

In operation, when in a first mode (e.g., the X4 signal has a low logical value indicating the x8 mode), each of the write drivers 310(0)-(7) may drive the respective pairs of the MIO CP0-15 signal lines to write the WD<127:0> data to the memory cell array, with masking performed based on the DWDM<1:0> signal, and the 311 may be configured to drive the ECC IO signal lines to write the WP<L:0> data to the memory cell array.

When in a second mode (e.g., the X4 signal has a high logical value indicating the x4 mode), each of the write drivers 310(0)-(7) may drive the respective pairs of the MIO CP0-15 signal lines to write the WD<127:0> and the WP<7:0> data to the memory cell array, and the 311 may be configured to drive the ECC IO signal lines to write the WP<L:0> data to the memory cell array. However, based on the DWDM<1:0> signals, the CORRECT<15:0> data, and bitwise differences between the CRD<127:0> data and the WD<127:0> data, the each of the write drivers 310(0)-(7) may mask write operations for certain bits of the WD<127:0> data that match previously-stored data bits. The previously-stored data information is available due to the read operation performed before the write operation while in the second mode. Thus, data write operations for the subset of bits of the WD<127:0> that include a direct copy of a subset of the CRD<127:0> data may be masked for bits that were not changed (e.g., based on the CORRECT<15:0> data) to avoid driving the pair of main I/O signal lines to write voltage polarities. In addition, data write operations for the subset of bits of the WD<127:0> that include new data (e.g., the DQ<M:0> data of FIG. 2, where M is equal to 64) may be masked for the bits that match corresponding bits of the CRD<127:0> data (e.g., old data) to avoid the driving the pair of main I/O signal lines to write voltage polarities. By masking write operations for at least some of the write data bits, current consumption driving the pair of main IO signal lines and during equalization may be reduced. While FIG. 3 depicts 8 of the write drivers 310(0)-(7), more or fewer than 8 MIO write drivers may be included without departing from the scope of the disclosure. Further, while FIG. 3 includes 128 bits of read and write data, 16 control planes, 8 bits of write parity data, etc., other combinations read and write data, control plane counts, and parity bit data may be implemented without departing from the scope of the disclosure.

Figure 4:
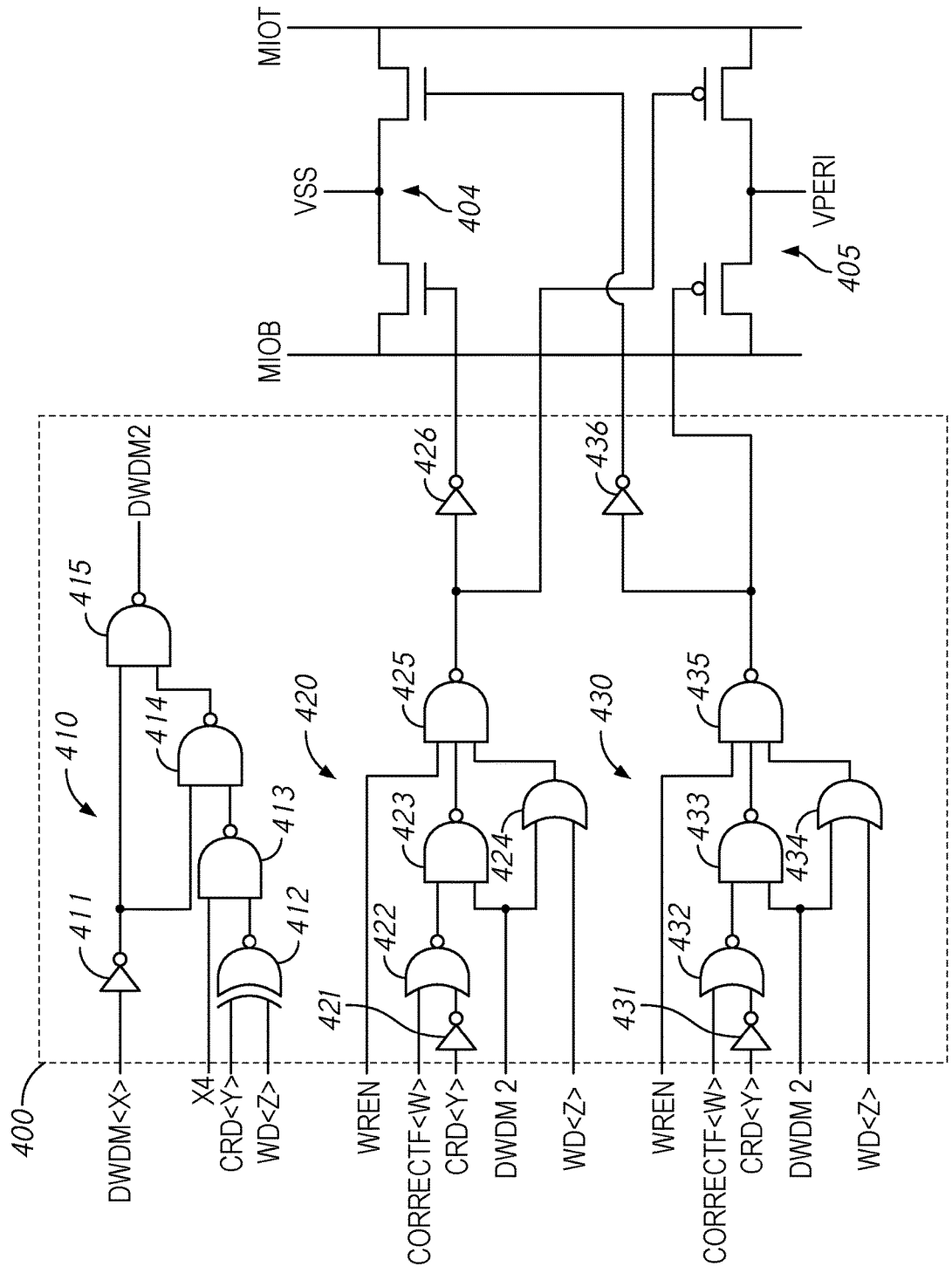
FIG. 4 is a schematic block diagram of a portion of a main input/output write driver configured to control voltages on complementary main IO signal lines, in accordance with an embodiment of the present disclosure.

FIG. 4 is a schematic block diagram of a portion of a write driver 400 configured to control voltages on complementary main IO signal lines MIOT and MIOB, in accordance with an embodiment of the present disclosure. The main IO write driver circuit 167 of FIG. 1, the main IO write driver circuit 267 of FIG. 2, and/or the any of the write drivers 310(0)-(7) of FIG. 3 may implement the portion of the write driver 400.

The write driver 400 may include a data write data mask generator 410, a first driver circuit 420, and a second driver circuit 430.

The data write data mask generator 410 may be configured to provide an internal data write data mask signal DWDM2 based on the DWDM<X> (e.g., the DWDM signal of FIG. 1, and/or one of the DWDM<1:0> signals from either or both of FIGS. 2 and 3), a comparison between the CRD<Y> bit (e.g., of the CRD<K:0> data of FIG. 2 or FIG. 3) and the WD<Z> bit (e.g., of the WD<K:0> data of FIG. 2 and/or FIG. 3), and an X4 signal configured to indicate a x4 or a x8 mode. In some examples, Y and Z are the same corresponding bits. The data write data mask generator 410 may include an inverter 411, an exclusive NOR gate 412, a NAND gate 413, a NAND gate 414, and a NAND gate 415. The inverter 411 may provide a complementary a logical value of the DWDM<X> signal to a first input of the NAND gate 414 and a first input of the NAND gate 414. The exclusive NOR gate 412 may perform an exclusive NOR logical comparison between the CRD<Y> bit (e.g., old data) and the WD<Z> bit (e.g., new data) and provide a result of the exclusive NOR comparison to a first input of the NAND gate 413. Thus, the output of the exclusive NOR gate 412 may indicate whether the old data matches the new data. The NAND gate 413 may perform a NAND logical comparison between the X4 signal and the output of the exclusive NOR gate 412 and provide an output based on the comparison to a second input of the NAND gate 414. The NAND gate 414 may perform a NAND logical comparison between the output of the inverter 411 and the output of the NAND gate 413 and provide an output based on the comparison to a second input of the NAND gate 415. The NAND gate 415 perform a NAND logical comparison between the output of the inverter 411 and the output of the NAND gate 414 to provide the DWDM2 based on the comparison.

The first driver circuit 420 and the second driver circuit 430 are configured to control the pull-down circuit 404 and the pull-up circuit 405 to drive the MIOT and MIOB signal lines to complementary logical values (e.g., based on the VSS and VPERI voltages). The MIOT and MIOB signal lines may be implemented in the MIOT/B signal lines of FIG. 1 and/or any of the MIO CP0-15 signal lines of FIG. 3.

The first driver circuit 420 may include an inverter 421, an OR gate 422, a NAND gate 423, an OR gate 424, a NAND gate 425, and an inverter 426. The OR gate 422 may be configured to perform a logical OR comparison between a logical complement of the CRD<Y> bit via the inverter 421 and a logical complement of the CORRECT<W> signal CORRECTF<W> (e.g., complement of any of the CORRECT<N:0> signals of FIG. 2 and/or FIG. 3) and provide an output based on the comparison to a first input of the NAND gate 423. The CORRECTF<W> signal having a high logical value indicates no bit error (e.g., no correction of bit necessary) and having a low logical indicates a single-bit error (e.g., bit should be corrected). The NAND gate 423 may perform a NAND logical comparison between the output of the OR gate 422 and the DWDM2 signal and provide an output based on the comparison to a first input of the NAND gate 425. The OR gate 424 may perform an OR logical comparison between the DWDM2 signal and the WD<Z> bit and provide an output based on the comparison to a second input of the NAND gate 425. The NAND gate 425 may perform a NAND logical comparison between the output of the NAND gate 423, the output of the OR gate 424, and a write enable signal WREN received at a third input and provide an output based on the comparison to a first n-type transistor of the pull-down circuit 404 via the inverter 426 and to a second p-type transistor of the pull-up circuit 405.

The second driver circuit 430 may include an inverter 431, an OR gate 432, a NAND gate 433, an OR gate 434, a NAND gate 435, and an inverter 436. The OR gate 432 may be configured to perform a logical OR comparison between the CRD<Y> bit and CORRECTF<W> signal and provide an output based on the comparison to a first input of the NAND gate 433. The NAND gate 433 may perform a NAND logical comparison between the output of the OR gate 432 and the DWDM2 signal and provide an output based on the comparison to a first input of the NAND gate 435. The OR gate 434 may perform an OR logical comparison between the DWDM2 signal and a logical complement of the WD<Z> bit via the inverter 431 and provide an output based on the comparison to a second input of the NAND gate 435. The NAND gate 435 may perform a NAND logical comparison between the output of the NAND gate 433, the output of the OR gate 434, and the WREN signal received at a third input and provide an output based on the comparison to a second n-type transistor of the pull-down circuit 404 via the inverter 436 and to a first p-type transistor of the pull-up circuit 405.

During a write operation (e.g., when the WREN enable signal is set to a high logical value), when in a first mode (e.g., the X4 signal has a low logical value indicating the x8 mode), one of the first driver circuit 420 or the second driver circuit 430 may enable a respective transistor of each of the pull-down circuit 404 and the pull-up circuit 405 to drive the pair of MIOT and MIOB signal lines to complementary logical voltages based on the DWDM<X> signal and the WREN signal. Within the data write data mask generator 410, the output of the NAND gate 413 is held high based on the X4 signal having a low logical value, which may cause the NAND gate 415 to provide the DWDM2 signal based on a value of the DWDM<X> signal (e.g., ignoring a value of the comparison between the CRD<Y> and WD<Z> bits).

When in a second mode (e.g., the X4 signal has a high logical value indicating the x4 mode), the first driver circuit 420 and the second driver circuit 430 may drive the respective pairs of the MIO CP0-15 signal lines to write the WD<K:0> and the WP<L:0> data to the memory cell array based on the DWDM<X> signal, a comparison between the CRD<Y> and WD<Z> bits, the CORRECTF<W> signal, and the WREN signal.

For example, within the data write data mask generator 410, when the DWDM<X> signal has a high logical value, the NAND gate 415 may provide the DWDM2 signal having a high logical value (e.g., when the WD<X> bit is old data from the read operation). When the DWDM<X> signal has a low logical value (e.g., when the WD<X> bit is new data), the NAND gate 415 may provide the DWDM2 signal having a low logical value when a value based on the comparison between the WD<X> bit and the CRD<Y> bit. Thus, when the WD<X> bit and the CRD<Y> bit match, the NAND gate 415 may provide the DWDM2 signal having a high logical value. When the WD<X> bit and the CRD<Y> bit have different logical values, the NAND gate 415 may provide the DWDM2 signal having a low logical value.

When the DWDM2 signal has a low logical value, the first driver circuit 420 may drive the MIOT signal line to a high logical value (e.g., the VPERI voltage) (e.g., by enabling the second p-type transistor of the pull-up circuit 405) and the MIOB signal line to a low logical value (e.g., the VSS voltage) (e.g., by enabling the first n-type transistor of the pull-up circuit 405) when the WD<Z> bit has a high logical value. When the DWDM2 signal has a high logical value, the first driver circuit 420 may drive the MIOT signal line to the high logical value (e.g., the VPERI voltage) and the MIOB signal line to the low logical value (e.g., the VSS voltage) when the RD<Y> bit has a high logical value and the CORRECTF<W> signal has a low logical value. Otherwise, the first driver circuit 420 may disable the first n-type transistor of the pull-down circuit 404 and the second p-type transistor of the pull-up circuit 405 to control voltages of the MIOB and MIOT signal lines, respectively.

When the DWDM2 signal has a low logical value, the second driver circuit 430 may drive the MIOB signal line to a high logical value (e.g., the VPERI voltage) (e.g., by enabling the first p-type transistor of the pull-up circuit 405) and the MIOT signal line to a low logical value (e.g., the VSS voltage) (e.g., by enabling the second n-type transistor of the pull-down circuit 404) when the WD<Z> bit has a low logical value. When the DWDM2 signal has a high logical value, the second driver circuit 430 may drive the MIOB signal line to the high logical value (e.g., the VPERI voltage) and the MIOT signal line to the low logical value (e.g., the VSS voltage) when the RD<Y> bit and the CORRECTF<W> signal both have a low logical values. Otherwise, the first driver circuit 420 may disable the first n-type transistor of the pull-down circuit 404 and the second p-type transistor of the pull-up circuit 405.

Thus, in summary, during the first mode of operation, data write operations are controlled by an external mask signal. Bitwise masking in the first mode may be limited because no read operation is performed before starting the data write operations. However, during the second mode of operation, a data read operation is first performed making previously stored data available. Thus, data write operations in the second mode may be masked for old read data that is not corrected (e.g., via the CORRECTF<W> signal having a high logical value) and for new data that matches old data that is not corrected. By masking write operations for at least some of the write data bits in the second mode, current consumption driving the MIOT and MIOB signal lines and during equalization may be reduced.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a read/write amplifier circuit configured to combine write data associated with a write command and read data received from a memory array to form combined data, wherein the read/write amplifier circuit is configured to determine an error correction code for the combined data, wherein the read/write amplifier circuit is configured to initiate a write operation to write a first bit of the combined data corresponding to the write data to the memory array, to mask writing of a second bit of the combined data corresponding to the read data, and to write the error correcting code to the memory array.

2. The apparatus of claim 1, wherein the read/write amplifier is configured to perform an error correction operation based on raw read data and a read data error correction code from the memory array to provide the corrected read data, wherein the read data is a subset of the corrected read data.

3. The apparatus of claim 2, wherein the corrected read data includes more bits than the write data.

4. The apparatus of claim 2, wherein the read/write amplifier is configured to mask a write operation of a particular bit of the combined data that corresponds to the write data in response to the particular bit matching a value of a corresponding bit of the raw read data.

5. The apparatus of claim 2, wherein the read/write amplifier comprises an error-correcting code (ECC) control circuit configured to generate the corrected read data based on the raw read data and the read data error correction code.

6. The apparatus of claim 5, wherein, when an error is detected in the raw read data, the ECC control circuit is configured to determine a location of the error in the raw read data using the read data error correction code to correct the error.

7. The apparatus of claim 5, wherein the ECC control circuit is further configured to determine the error correction code for the combined data.

8. The apparatus of claim 1, wherein the read/write amplifier is configured to cause a column decoder to disable a column select signal to mask writing of a second bit of the combined data corresponding to the read data.

9. The apparatus of claim 1, wherein the read/write amplifier circuit is configured to combine the write data associated with the write command and the read data received from the memory array to form the combined data while in a first mode of operation, wherein the read-write amplifier circuit is further configured to write second write data associated with a second write command to the memory array during while in a second mode of operation.

10. The apparatus of claim 9, wherein the write data received while in the first mode of operation includes fewer bits than the second write received while in the second mode.

11. The apparatus of claim 1, wherein the read/write amplifier circuit is configured to disable first pull-up and pull-down circuitry coupled to a first pair of main I/O lines to mask writing of the second bit of the combined data corresponding to the read data to the memory array, and to enable second pull-up and pull-down circuitry coupled to a second pair of main I/O lines to write the first bit of the combined data corresponding to the write data to the memory array.

12. A method comprising:
combining, at a semiconductor device, write data corresponding to a write command with read data retrieved from a memory cell array of the semiconductor device to provide combined data;
during a write operation directed to the combined data:
masking a first bit of the combined data that corresponds to the read data from being written to the memory cell array; and
writing a second bit of the combined data that corresponds to the write data to the memory cell array.

13. The method of claim 12, further comprising performing an error correction operation based on raw read data and a read data error correction code from the memory array to provide the corrected read data, wherein the read data is a subset of the corrected read data.

14. The method of claim 13, wherein the corrected read data includes more bits than the write data.

15. The method of claim 13, further comprising masking a write operation of a particular bit of the combined data that corresponds to the write data in response to the particular bit matching a value of a corresponding bit of the raw read data.

16. The method of claim 13, further comprising, in response to detection of an error in the raw read data, determining a location of the error in the raw read data using the read data error correction code to correct the error.

17. The method of claim 16, further comprising determining the error correction code for the combined data.

18. The method of claim 13, further comprising:
combining the write data associated with the write command and the read data received from the memory array to form the combined data while in a first mode of operation; and
writing second write data associated with a second write command to the memory array during while in a second mode of operation.

19. The method of claim 18, wherein the write data received while in the first mode of operation includes fewer bits than the second write received while in the second mode.

20. The method of claim 12, further comprising writing an error correction code for the combined data to the memory cell array.

* * * * *